United States Patent [19]
Chen et al.

[11] Patent Number: 6,072,677
[45] Date of Patent: Jun. 6, 2000

[54] ELECTROSTATIC DISCHARGE PROTECTIVE CIRCUIT FORMED BY USE OF A SILICON CONTROLLED RECTIFIER

[75] Inventors: Mainn-Gwo Chen, Taichung; Ming-Jer Chen, Hsinchu; Chuan H. Liu, Taipei, all of Taiwan

[73] Assignee: United Microelectronics Corp., Hsinchu, Taiwan

[21] Appl. No.: 09/184,897

[22] Filed: Nov. 3, 1998

[51] Int. Cl.[7] .................................................. H02H 9/04
[52] U.S. Cl. ............................................. 361/56; 361/111
[58] Field of Search ................................. 361/54, 56, 58, 361/93.1, 100, 88, 91.5, 111; 257/355, 360, 361

[56] References Cited

U.S. PATENT DOCUMENTS

| | | | |
|---|---|---|---|
| 5,400,202 | 3/1995 | Metz et al. | 361/56 |
| 5,671,111 | 9/1997 | Chen | 361/56 |
| 5,682,047 | 10/1997 | Consiglio et al. | 257/335 |
| 5,869,873 | 2/1999 | Yu | 257/362 |

*Primary Examiner*—Jeffrey Gaffin
*Assistant Examiner*—Kim Huynh
*Attorney, Agent, or Firm*—Oblon, Spivak, McClelland, Maier & Neustadt, P.C.

[57] ABSTRACT

An electrostatic discharge protective circuit formed by use of a silicon controller rectifier is coupled to an input port and an internal circuit for discharging electrostatic charges on the input port to ground. When the electrostatic charges are applied on the input port, a punch-through effect is created between a first P-type diffusion region and a second N-type diffusion region to turn on a parasitic NPN bipolar junction transistor. At the same time, a voltage is applied on a gate of the MOS transistor via a small-signal equivalent capacitor to turn on itself, thereby discharging the electrostatic charges. Accordingly, the trigger voltage of the silicon controller rectifier can be efficiently lowered to improve the electrostatic discharge protective capability of the silicon control rectifier.

18 Claims, 2 Drawing Sheets

ELECTROSTATIC DISCHARGE PROTECTIVE CIRCUIT FORMED BY USE OF A SILICON CONTROLLED RECTIFIER

BACKGROUND OF THE INVENTION

1. Field of the Invention

The invention relates to an electrostatic discharge protective circuit formed by use of a silicon controlled rectifier, and in particular to an electrostatic discharge protective circuit which can efficiently protect an internal circuit from damage by lowering the trigger voltage of the silicon controller rectifier.

2. Description of the Related Art

Currently, in ICs processes including a deep sub-micron IC process, an electrostatic discharge has been a main factor to cause IC damage. To overcome the problem of the electrostatic discharge, on-chip electrostatic discharge protective circuits are designed to connect input/output ports. However, the electrostatic discharge protective circuits can not provide a sufficient protective capability in line with continuous developments of the IC processes. Therefore, it is urgently desired to enhance the efficiency of the electrostatic discharge protective circuits in semiconductor industry.

In general, each electrostatic discharge protective circuit has characteristics of a high critical voltage, a small lay-out area and a low RC delay. Since silicon controller rectifiers have a high current sinking/sourcing capability, a low turn-on impedance, a low power consumption and a high heat dissipation capability, they are widely used to form electrostatic discharge protective circuits.

Referring to FIG. 1, there is shown an electrostatic discharge protective circuit formed by use of a traditional silicon controller rectifier 10. In FIG. 1, electrostatic charges, so-called over-stress, on an input port (I/P) can be discharged via the traditional silicon controller rectifier 10 to ground Vss. Thus, the electrostatic charges cannot flow into an internal circuit 14 via a buffer input gate 12 to damage the internal circuit 14.

FIG. 2 is a cross-sectional view of the traditional silicon controller rectifier 10 of FIG. 1. FIG. 3 is an equivalent circuit diagram of the traditional silicon controller rectifier 10 of FIG. 2. As shown in FIGS. 2 and 3, a $P^+$-type diffusion region 20, an $N^+$-type well 21 and a P-type substrate 22 form a parasitic PNP bipolar junction transistor B1. An N-type well 21, a P-type substrate 22 and an $N^+$-diffusion region 23 form a parasitic NPN bipolar junction transistor B2. An equivalent resistor R1 is formed between the P-type substrate 22 and a $P^+$-type diffusion region 24. The $P^+$-type diffusion region 20 and an N+-type diffusion region 25 are electrically coupled to the input port (I/P). Furthermore, the base of the PNP bipolar junction transistor B1 is electrically coupled to the collector of the NPN bipolar junction transistor B2. The collector of the PNP bipolar junction transistor B1 and the base of the NPN bipolar junction transistor are electrically coupled to the ground Vss via the resistor R1. Thus, the traditional silicon controller rectifier 10 is completely formed. The silicon controller rectifier 10 performs an electrostatic discharge by creating a punch-through effect. For example, the punch-through effect is triggered by a breakdown between the N-type well 21 and the P-type substrate 22. However, a trigger voltage larger than 10V, or even as many as 25V, is required. Therefore, it is not suitable for the deep sub-micron semiconductor process.

In order to attain the preferable function of the electrostatic discharge protection, the trigger voltage of the electrostatic discharge protective circuit must be smaller than the breakdown voltage of the buffer input gate 12. Although, the traditional silicon controller rectifier is widely used for the electrostatic discharge, its trigger voltage is much higher. As we know that the smaller the sizes of semiconductor devices, the lower the operating voltage. Therefore, when electrostatic charges are applied on the input port, it is possible that the over stress, smaller than the trigger voltage of the electrostatic discharge protective circuit, is large enough to damage the internal circuit.

SUMMARY OF THE INVENTION

In view of the above, a first object of the invention is to provide an electrostatic discharge protective circuit formed by a silicon controller rectifier. A punch-through effect is created between a $P^+$-diffusion region and an $N^+$-type diffusion region to apply an instantaneous over stress on the drain of an MOS transistor. Furthermore, a resistor is electrically coupled between the gate of the MOS transistor and ground to lower the trigger voltage of the silicon controller rectifier by using the characteristics of a common-source MOS transistor, thereby improving the electrostatic discharge protective capability of the silicon controller rectifier.

The electrostatic discharge protective circuit formed by use of a silicon controlled rectifier according to the invention is electrically coupled to an input port and an internal circuit for discharging electrostatic charges on the input port to ground. The electrostatic discharge protective circuit includes a PNP bipolar junction transistor, an NPN bipolar junction transistor, a first resistor and an MOS transistor and a second resistor.

The emitter of the PNP bipolar junction transistor is electrically coupled to the internal circuit. The collector of the NPN bipolar junction transistor is electrically coupled to the base of the PNP bipolar junction transistor. The collector of the PNP bipolar junction and the base of the NPN bipolar junction transistor are electrically connected to ground via the first resistor. The emitter of the NPN bipolar transistor is also electrically coupled to the ground. The drain of the MOS transistor is electrically coupled to the base of the PNP bipolar junction transistor and the collector of the NPN bipolar junction transistor. The source of the MOS transistor is electrically coupled to the ground. The gate of the MOS transistor is electrically coupled to the ground via the second resistor which is used to create a discharge bias for the MOS transistor. In addition, a small-signal equivalent capacitor exists between the gate and the drain of the MOS transistor. An instantaneous voltage is applied on the gate via the equivalent capacitor to turn on the MOS transistor when electrostatic charges are applied on the input port.

A second object of the invention is to provide a structure of an electrostatic discharge protective circuit which is electrically coupled to an input port and an internal circuit for discharging electrostatic charges on the input port to ground. The structure of the electrostatic discharge protective circuit includes a P-type substrate, an N-type well, a first P-type diffusion region, an MOS transistor, a second P-type diffusion region and a first resistor. The N-type well is formed in the P-type substrate. The first P-type diffusion region is formed in the N-type well, adjacent to a first N-type diffusion region and electrically coupled to the input port and the internal circuit. A second N-type diffusion region serves as the drain of the MOS transistor. A third N-type diffusion region serves as the source of the MOS transistor. The second N-type diffusion region is formed on a junction between the P-type substrate and the N-type well and close to the first P-type diffusion region. The third N-type diffusion region is formed in the p-type substrate outside the N-type well and electrically coupled to the ground. The gate of the MOS transistor is electrically coupled to the ground via the second resistor. A small-signal equivalent capacitor is electrically coupled between the drain and the gate of the MOS transistor. The second P-type diffusion region is formed in the P-type substrate and electrically coupled to the ground, wherein a first resistor is formed between the second P-type diffusion region and the P-type substrate.

The first P-type diffusion region, the N-type well and the P-type substrate form a parasitic PNP bipolar junction transistor. The N-type well, the P-type substrate and the third N-type diffusion region form a parasitic NPN bipolar junction transistor. When electrostatic charges are applied on the input port, a punch-through effect is created between the first P-type diffusion region and the second N-type diffusion region to turn on the NPN bipolar junction transistor. Moreover, an instantaneous voltage is applied on the gate of the MOS transistor via the small-signal equivalent capacitor. Accordingly, the trigger voltage of the silicon controller rectifier can be efficiently lowered to improve the electrostatic discharge protective capability of the silicon control rectifier.

BRIEF DESCRIPTION OF THE DRAWINGS

The invention will be more fully understood from the detailed description given hereinbelow and the accompanying drawings, which are given by way of illustration only, and thus do not limit the present invention, and wherein.

DETAILED DESCRIPTION OF THE EMBODIMENTS

Figure 1:
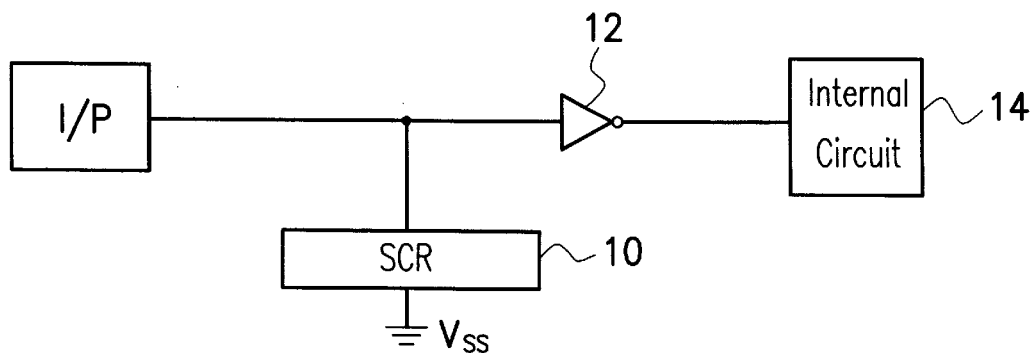
FIG. 1 is a circuit block diagram showing an electrostatic discharge protective circuit formed by use of a silicon controller rectifier according to the prior art.
Figure 2:
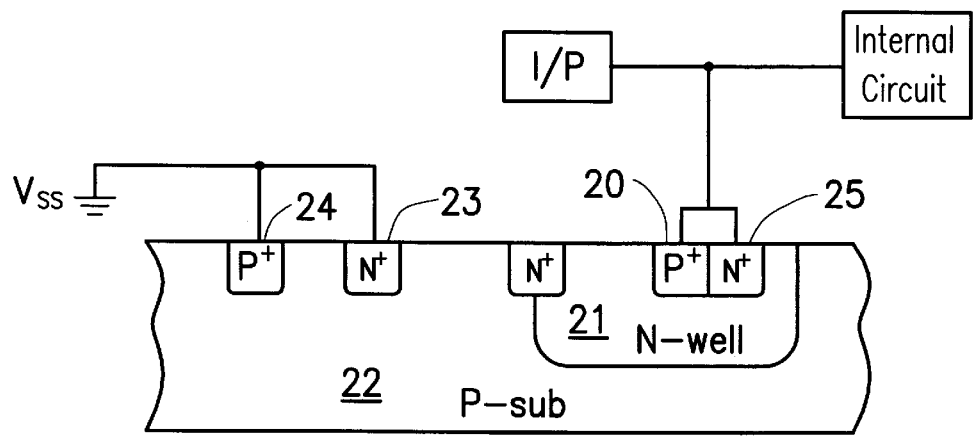
FIG. 2 is a cross-sectional view showing the structure of a silicon controller rectifier according to the prior art.
Figure 3:
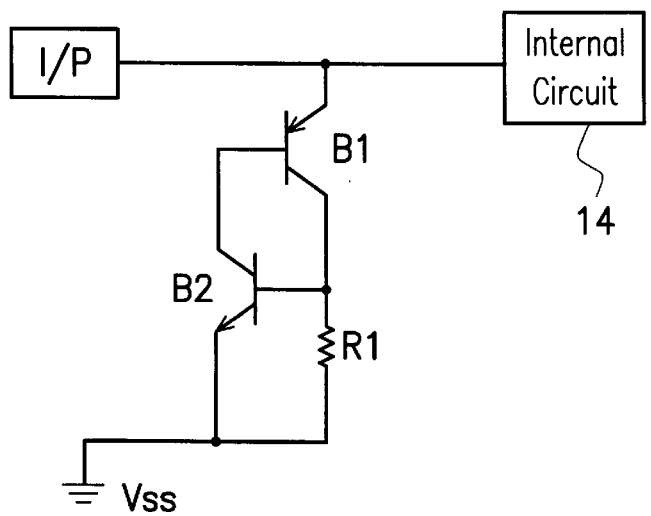
FIG. 3 is an equivalent circuit diagram of the silicon controller rectifier of FIG. 2.
Figure 4:
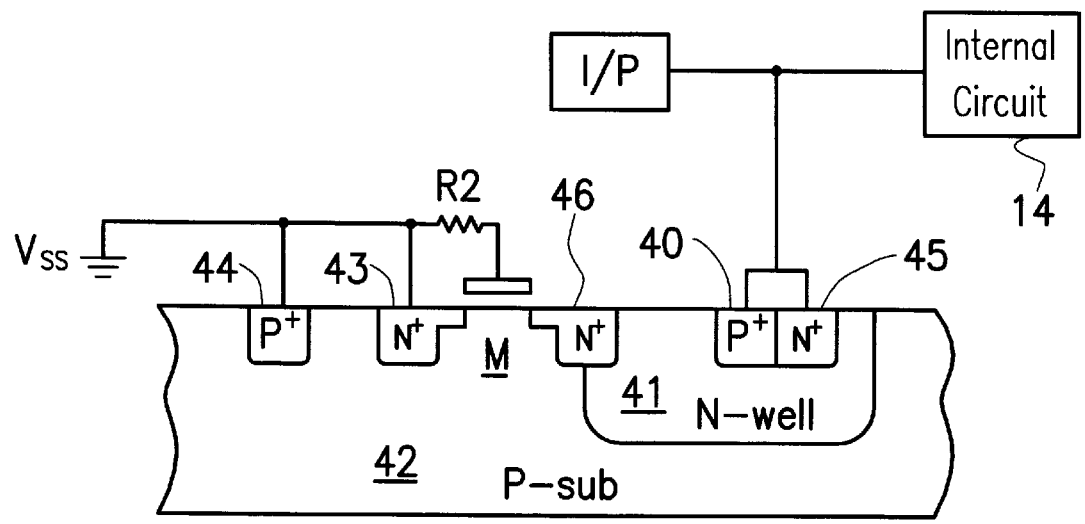
FIG. 4 is a cross-sectional view showing the structure of a silicon controller rectifier according to a preferred embodiment of the invention.
Figure 5:
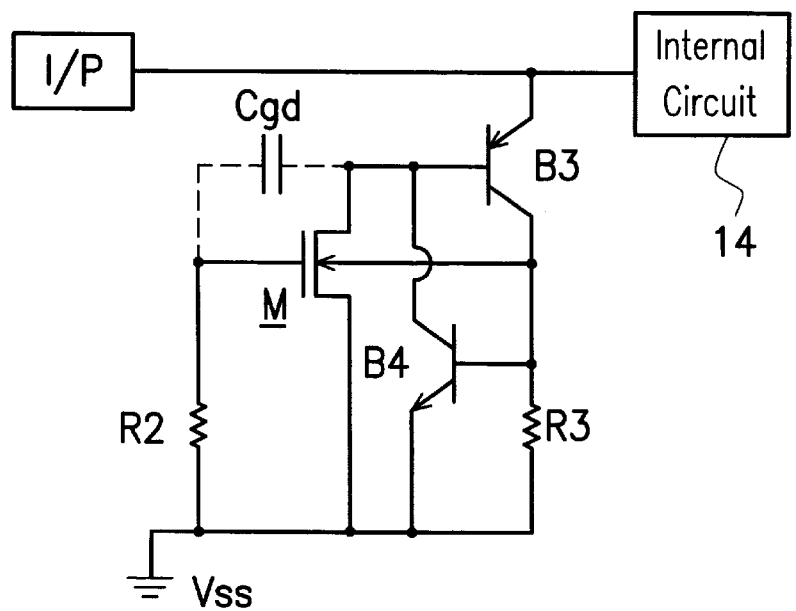
FIG. 5 is an equivalent circuit diagram of the silicon controller rectifier of FIG. 4.

FIG. 4 shows a silicon controller rectifier according to a preferred embodiment of the invention is shown. FIG. 5 shows an equivalent circuit of the silicon controller rectifier of FIG. 4. Referring to FIGS. 4 and 5, a P$^+$-type diffusion region 40, an N-type well 41 and a P-type substrate 42 form a parasitic PNP bipolar junction transistor B3. The N-type well 41, the P-type substrate 42 and an N$^+$-type diffusion region 43 of the MOS transistor M form a parasitic NPN bipolar junction transistor B4. An equivalent resistor R3 is formed between the P-type substrate 42 and the P$^+$-type diffusion region 44. Together, the P$^+$-diffusion region 40 and an N$^+$-type diffusion region 45 are electrically coupled to an input port I/P and an internal circuit 14. The gate of the MOS transistor M is electrically coupled to the source of thereof (the N$^+$ diffusion region 43), the P$^+$-type diffusion region 44, and ground Vss via a resistor R2. Furthermore, the emitter of the PNP bipolar junction transistor B3 is electrically coupled to the input port I/P and the internal circuit 14. The base of the PNP bipolar junction transistor B3 is electrically coupled to the collector of the NPN bipolar junction transistor. A small-signal equivalent capacitor Cgd exists between the gate and the drain of the MOS transistor M. The small-signal equivalent capacitor Cgd is not a physical capacitor but intrinsically has an equivalent capacitance. The collector of the PNP bipolar junction transistor B3 and the base of the NPN bipolar junction transistor are electrically coupled to the ground Vss via the resistor R3. The drain of the MOS transistor (N$^+$-type diffusion region 46) is formed on a junction between the N-type well 41 and the P-type substrate 42.

In the silicon controlled rectifier according to the invention, when an over stress is applied on the input port to cause a punch-through effect between the P$^+$-type diffusion region 40 and the N$^+$-type diffusion region 46, an instantaneous voltage is applied on the collector of the NPN bipolar junction transistor B4 and the drain of the MOS transistor M. As a result, the NPN bipolar junction transistor B4 is first turned on, wherein the equivalent resistor R3 is used to provide the NPN bipolar junction transistor B4 a normal bias. Thereafter, the PNP bipolar junction transistor B3 is turned on.

In addition, an equivalent capacitor Cgd, existing between the gate and the drain of the MOS transistor, can be electrically charged when the instantaneous voltage is applied on the drain of the MOS transistor. At this point, since the resistor R2, having a resistance of larger than 10 KΩ, is electrically coupled between the gate and the source of the MOS transistor M, a bias is created between the gate and the source of the MOS transistor to turn on the MOS transistor for discharging. Accordingly, the trigger voltage of the silicon controller rectifier according to the invention is greatly lowered to about 6V thereby to improve the efficiency of the electrostatic discharge protective circuit.

As described above, a feature of the electrostatic discharge protective circuit is to greatly lower the trigger voltage of the silicon controller rectifier thereby to improve the efficiency thereof by using the punch-through effect, the small-signal equivalent capacitor of the common-source MOS transistor and the series resistor electrically coupled between the gate and the source of the MOS transistor.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An electrostatic discharge protective circuit formed by the use of a silicon controlled rectifier, electrically coupled to an input port and an internal circuit for discharging electronic charges on the input port to ground, the electrostatic discharge protective circuit comprising:

a PNP bipolar junction transistor having a first emitter, a first base and a first collector, the input port and internal circuit being electrically coupled to said protective circuit only through said first emitter;

a NPN bipolar junction transistor having a second emitter electrically coupled to the ground, a second base and a second collector electrically coupled to the first base;

a first resistor, of which a first terminal is electrically coupled to the first collector and the second base, and a second terminal is electrically coupled to the ground;

an MOS transistor having a source electrically coupled to the ground, a drain electrically coupled to the first base and the second collector, and a gate; and a second resistor, of which a first terminal is electrically coupled to the gate, and a second terminal is electrically coupled to the ground.

2. The electrostatic discharge protective circuit of claim 1, wherein a capacitor intrinsically exists between the drain and the gate of the MOS transistor.

3. The electrostatic discharge protective circuit of claim 2, wherein a voltage is generated on the gate via the capacitor to turn of the MOS transistor when electrostatic charges are applied on the input port.

4. The electrostatic discharge protective circuit of claim 1, wherein the first resistor is used to maintain the NPN bipolar junction transistor at a working bias.

5. The electrostatic discharge protective circuit of claim 1, wherein the second resistor is used to maintain the MOS transistor at a working bias.

6. The electrostatic discharge protective circuit of claim 1, wherein the second resistor has a resistance of larger than 10 KΩ.

7. The electrostatic discharge circuit of claim 1, wherein the input port and internal circuit are directly coupled only to the emitter of the PNP transistor.

8. The electrostatic discharge circuit of claim 1, wherein the gate is connected only to the first terminal of the second resistor.

9. The electrostatic discharge circuit of claim 1, wherein the first base is connected only to the second collector and the drain.

10. An electrostatic discharge protective circuit formed by use of a silicon controlled rectifier, electrically coupled to an input port and an internal circuit for discharging electrostatic charges on the input port to ground, the electrostatic discharge protective circuit comprising:

a P-type substrate;

an N-type well formed in the P-type substrate;

a first P-type diffusion region and a first N-type diffusion region adjacent to each other, formed in the N-type well together and electrically coupled to the input port and the internal circuit;

an MOS transistor having a second N-type diffusion region serving as a drain, a third N-type diffusion region serving as a source, wherein the second N-type diffusion region is located on a junction between the P-type substrate and the N-type well and close to the first P-type diffusion region, and the third N-type diffusion region is located in the P-type substrate outside the N-type well and electrically coupled to the ground;

a second P-type diffusion region located in the P-type substrate and electrically coupled to the ground; and a first resistor, of which a first terminal is electrically coupled to a gate of the MOS transistor and a second terminal is electrically coupled to the ground.

11. The electrostatic discharge protective circuit of claim 10, wherein the first P-type diffusion, the N-type well and the P-type substrate form a parasitic PNP bipolar junction transistor.

12. The electrostatic discharge protective circuit of claim 10, wherein the N-type well, the P-type substrate and the third N-type diffusion region form a parasitic NPN bipolar junction transistor.

13. The electrostatic discharge protective circuit of claim 12, wherein a punch-through effect is created between the first P-type diffusion region and the second N-type diffusion region to turn on the NPN bipolar junction transistor when electrostatic charges are applied on the input port.

14. The electrostatic discharge protective circuit of claim 10, wherein a second resistor intrinsically exists between the P-type substrate and the second P-type diffusion region.

15. The electrostatic discharge protective circuit of claim 10, wherein a capacitor intrinsically exists between the drain of the gate of the MOS transistor.

16. The electrostatic discharge protective circuit of claim 15, wherein a voltage is created on the gate via the capacitor to turn on the MOS transistor when electrostatic charges are applied on the input port.

17. The electrostatic discharge protective circuit of claim 10, wherein the first resistor is used to maintain the MOS transistor at a working bias.

18. The electrostatic discharge protective circuit of claim 10, wherein the first resistor has a resistance of larger than 10 KΩ.

* * * * *